United States Patent
Jeong et al.

(10) Patent No.: US 12,550,544 B2
(45) Date of Patent: Feb. 10, 2026

(54) DISPLAY APPARATUS

(71) Applicant: Samsung Display Co., Ltd., Yongin-si (KR)

(72) Inventors: Jaewoo Jeong, Yongin-si (KR); Juhyun Lee, Yongin-si (KR); Byungsoo So, Yongin-si (KR); Taewook Kang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 624 days.

(21) Appl. No.: 17/958,518

(22) Filed: Oct. 3, 2022

(65) Prior Publication Data

US 2023/0111736 A1    Apr. 13, 2023

(30) Foreign Application Priority Data

Oct. 8, 2021 (KR) .......................... 10-2021-0134438

(51) Int. Cl.
| | | |
|---|---|---|
| *H10K 59/126* | (2023.01) | |
| *H10K 59/12* | (2023.01) | |
| *H10K 59/124* | (2023.01) | |
| *H10K 71/00* | (2023.01) | |

(52) U.S. Cl.
CPC .......... *H10K 59/126* (2023.02); *H10K 71/00* (2023.02); *H10K 59/1201* (2023.02); *H10K 59/124* (2023.02)

(58) Field of Classification Search
CPC .. H10K 59/126; H10K 71/00; H10K 59/1201; H10K 59/124; H10K 59/8731; H10D 30/6755; H10D 59/123

See application file for complete search history.

(56) References Cited

U.S. PATENT DOCUMENTS

| | | | |
|---|---|---|---|
| 10,366,635 B2 | 7/2019 | Kim et al. | |
| 10,600,824 B2 | 3/2020 | Lee et al. | |
| 10,923,549 B2 | 2/2021 | Lee et al. | |
| 11,784,190 B2 | 10/2023 | Son et al. | |
| 12,317,736 B2 * | 5/2025 | Hong | H10K 59/131 |
| 2020/0310499 A1 | 10/2020 | Chung et al. | |
| 2021/0313527 A1 * | 10/2021 | Hong | H10K 77/111 |
| 2022/0149143 A1 * | 5/2022 | Lee | H10K 59/126 |
| 2022/0181416 A1 * | 6/2022 | Kim | H10K 59/124 |
| 2022/0208924 A1 * | 6/2022 | Choi | H10D 86/481 |

FOREIGN PATENT DOCUMENTS

| | | |
|---|---|---|
| KR | 10-2018-0007375 | 1/2018 |
| KR | 10-2019-0028594 A | 3/2019 |
| KR | 10-2020-0003953 A | 1/2020 |
| KR | 10-2020-0073347 A | 6/2020 |
| KR | 10-2020-0111356 | 9/2020 |
| KR | 10-2020-0115825 | 10/2020 |

* cited by examiner

*Primary Examiner* — Douglas W Owens
(74) *Attorney, Agent, or Firm* — Innovation Counsel LLP

(57) ABSTRACT

A display apparatus a substrate including a lower organic layer, a lower barrier layer, an upper organic layer, and an upper barrier layer, which are sequentially stacked on each other, a pixel circuit layer on the substrate, and a display element layer on the pixel circuit layer. The upper barrier layer includes a first inorganic barrier layer on the upper organic layer, a shielding layer on the first inorganic barrier layer, the shielding layer comprising an oxide semiconductor material, and a second inorganic barrier layer on the shielding layer.

21 Claims, 11 Drawing Sheets

DISPLAY APPARATUS

CROSS-REFERENCE TO RELATED APPLICATION(S)

This application claims priority to and benefits of Korean Patent Application No. 10-2021-0134438 under 35 U.S.C. § 119, filed on Oct. 8, 2021 in the Korean Intellectual Property Office, the entire contents of which are incorporated herein by reference.

BACKGROUND

1. Technical Field

One or more embodiments relate to a display apparatus that includes an oxide semiconductor and is driven by a thin-film transistor.

2. Description of the Related Art

In general, a display apparatus includes a display element and a driving circuit configured to control an electrical signal applied to the display element. The driving circuit includes a thin-film transistor, a storage capacitor, and multiple wirings.

In order to accurately control light emission or non-emission of the display element and the degree of light emission, the number of thin-film transistors electrically connected to a display element has increased. Therefore, studies have been actively conducted to solve problems of high integration and power consumption of display apparatuses.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

One or more embodiments may include a display apparatus that may include an oxide semiconductor and may be driven by a thin-film transistor to reduce power consumption of the display apparatus and improve display quality of the display apparatus.

However, this is merely an example, and the scope of the disclosure is not limited thereby.

Additional aspects will be set forth in part in the description which follows and, in part, will be apparent from the description, or may be learned by practice of the presented embodiments of the disclosure.

According to one or more embodiments, a display apparatus may include a substrate including a lower organic layer, a lower barrier layer, an upper organic layer, and an upper barrier layer, which may be sequentially stacked on each other, a pixel circuit layer on the substrate, and a display element layer on the pixel circuit layer. The upper barrier layer includes a first inorganic barrier layer on the upper organic layer, a shielding layer on the first inorganic barrier layer, the shielding layer including an oxide semiconductor material, and a second inorganic barrier layer on the shielding layer.

In an embodiment, the shielding layer may include at least one of indium gallium zinc oxide (IGZO), indium tin zinc oxide (ITZO), and indium tin gallium zinc oxide (ITGZO).

In an embodiment, a thickness of the shielding layer may be about 50 Å to about 10,000 Å.

In an embodiment, the shielding layer may cover an entire surface of the substrate.

In an embodiment, the upper organic layer may include polyimide.

In an embodiment, the display apparatus may further include a first buffer layer and a second buffer layer that are between the substrate and the pixel circuit layer. The second inorganic barrier layer may include a first inorganic insulating material, the first buffer layer may include a second inorganic insulating material, and the first inorganic insulating material may be different from the second inorganic insulating material.

In an embodiment, the second inorganic insulating material may include silicon nitride ($SiN_x$).

In an embodiment, the first inorganic insulating material may include silicon oxide ($SiO_x$).

In an embodiment, the first inorganic barrier layer may include the first inorganic insulating material.

In an embodiment, a sum of a thickness of the second inorganic barrier layer, a thickness of the first buffer layer, and a thickness of the second buffer layer may be about 3,500 Å to about 15,000 Å.

In an embodiment, the pixel circuit layer may include a thin-film transistor, the thin-film transistor may include a semiconductor layer, a gate electrode at least partially overlapping the semiconductor layer in a plan view, and an electrode layer on the gate electrode, and the shielding layer and the semiconductor layer may include a same material.

According to one or more embodiments, a method of manufacturing a display apparatus may include forming a lower organic layer on a carrier substrate, forming a lower barrier layer on the lower organic layer, forming an upper organic layer on the lower barrier layer, forming an upper barrier layer on the upper organic layer, the upper barrier layer including an oxide semiconductor material, forming a pixel circuit layer on the upper barrier layer, forming a display element layer on the pixel circuit layer, and removing the carrier substrate.

In an embodiment, the forming of the upper barrier layer may include forming a first inorganic barrier layer on the upper organic layer, forming a shielding layer on the first inorganic barrier layer, the shielding layer including an oxide semiconductor material, and forming a second inorganic barrier layer on the shielding layer.

In an embodiment, the shielding layer may include at least one of indium gallium zinc oxide (IGZO), indium tin zinc oxide (ITZO), and indium tin gallium zinc oxide (ITGZO).

In an embodiment, a thickness of the shielding layer may be about 50 Å to about 10,000 Å.

In an embodiment, a proportion of oxygen in a mixed gas inside a chamber may be about 10% to about 80% in the forming of the shielding layer.

In an embodiment, the forming of the pixel circuit layer may include sequentially forming a first buffer layer and a second buffer layer on the upper barrier layer, forming a semiconductor layer on the second buffer layer, forming a gate electrode on the semiconductor layer, and forming an electrode layer on the gate electrode, and the semiconductor layer and the shielding layer may include a same material.

In an embodiment, the second inorganic barrier layer may include a first inorganic insulating material, the first buffer layer may include a second inorganic insulating material, and the first inorganic insulating material may be different from the second inorganic insulating material.

In an embodiment, the second inorganic insulating material may include silicon nitride ($SiN_x$).

In an embodiment, a sum of a thickness of the second inorganic barrier layer, a thickness of the first buffer layer, and a thickness of the second buffer layer may be about 3,500 Å to about 15,000 Å.

Other aspects, features, and advantages of the disclosure will become better understood through the accompanying drawings, the claims, and the detailed description.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION OF THE EMBODIMENTS

Figure 1:
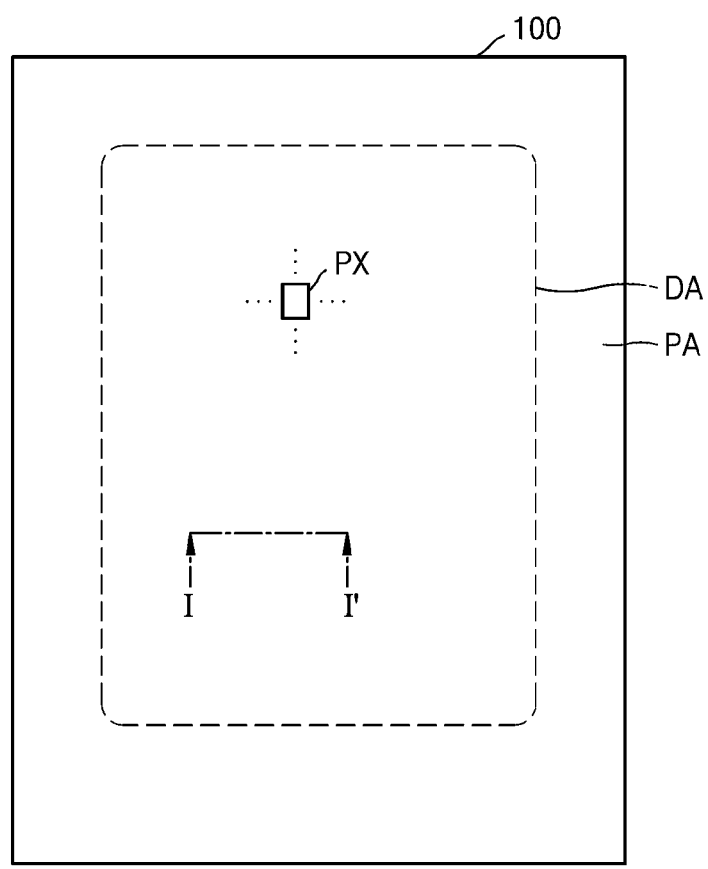
FIG. 1 is a diagram schematically illustrating a display apparatus according to one or more embodiments.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the description.

As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or." Throughout the disclosure, the expression "at least one of a, b and c" indicates only a, only b, only c, both a and b, both a and c, both b and c, all of a, b, and c, or variations thereof.

It will be understood that although the terms, the "first," "second" etc. may be used herein to describe various elements, these elements should not be limited by these terms. These terms are only used to distinguish one element from another.

The singular forms "a," "an," and "the" as used herein are intended to include the plural forms as well unless the context clearly indicates otherwise.

It will be further understood that the terms "include", "has", "have", and/or "comprise" used herein specify the presence of stated features or elements, but do not preclude the presence or addition of one or more other features or elements.

It will be further understood that, when a layer, region, or element is referred to as being "on" another layer, region, or element, it may be directly or indirectly on the other layer, region, or element. For example, intervening layers, regions, or elements may be present.

It will be further understood that when layers, regions, or elements are referred to as being connected to each other, they may be directly connected to each other or indirectly connected to each other with intervening layers, regions, or elements therebetween. For example, when layers, regions, or elements are referred to as being electrically connected to each other, they may be directly electrically connected to each other or indirectly electrically connected to each other with intervening layers, regions, or elements therebetween.

When a certain embodiment may be implemented differently, a specific process order may be performed differently from the described order. For example, two consecutively described processes may be performed substantially at the same time or performed in an order opposite to the described order.

Also, sizes of elements in the drawings may be exaggerated or reduced for convenience of explanation. For example, because sizes and thicknesses of elements in the drawings may be arbitrarily illustrated for convenience of explanation, the disclosure is not limited thereto.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a diagram schematically illustrating a display apparatus according to one or more embodiments.

The display apparatus according to embodiments may be implemented as electronic apparatuses such as smartphones, mobile phones, navigation devices, game consoles, televisions (TVs), vehicle head units, notebook computers, laptop computers, tablet computers, personal media players (PMPs), or personal digital assistants (PDAs). Also, the electronic apparatuses may be flexible apparatuses.

A substrate 100 may be divided into a display area DA in which an image may be displayed and a peripheral area PA around the display area DA.

The substrate 100 may include various materials such as glass, metal, plastic, or a combination thereof. According to an embodiment, the substrate 100 may include a flexible material. The flexible material refers to a bendable, foldable, or rollable substrate. The substrate 100 including the flexible material may include ultra-thin glass, metal, plastic, or a combination thereof.

Pixels PX including various display elements such as organic light-emitting diodes may be in the display area DA of the substrate 100. Multiple pixels PX may be provided. The pixels PX may be arranged in various forms such as a stripe arrangement, a PenTile® arrangement, or a mosaic arrangement and may implement an image.

When viewed from a plan view, the display area DA may have a rectangular shape, as illustrated in FIG. 1. In another embodiment, the display area DA may have a polygonal shape such as a triangular, pentagonal, or hexagonal shape, a circular shape, an elliptical shape, or an irregular shape.

The peripheral area PA of the substrate 100 may be an area around the display area DA, and may be an area in which an image may not be displayed. Various wirings configured to transmit electrical signals to the display area DA and pads to which a printed circuit board or a driver integrated circuit (IC) chip is attached may be located in the peripheral area PA.

Hereinafter, for convenience, the display apparatus including an organic light-emitting diode as the display element will be described. However, embodiments may be applied to various types of display apparatuses such as a liquid crystal display, an electrophoretic display, and an inorganic electroluminescence (EL) display.

Figure 2:
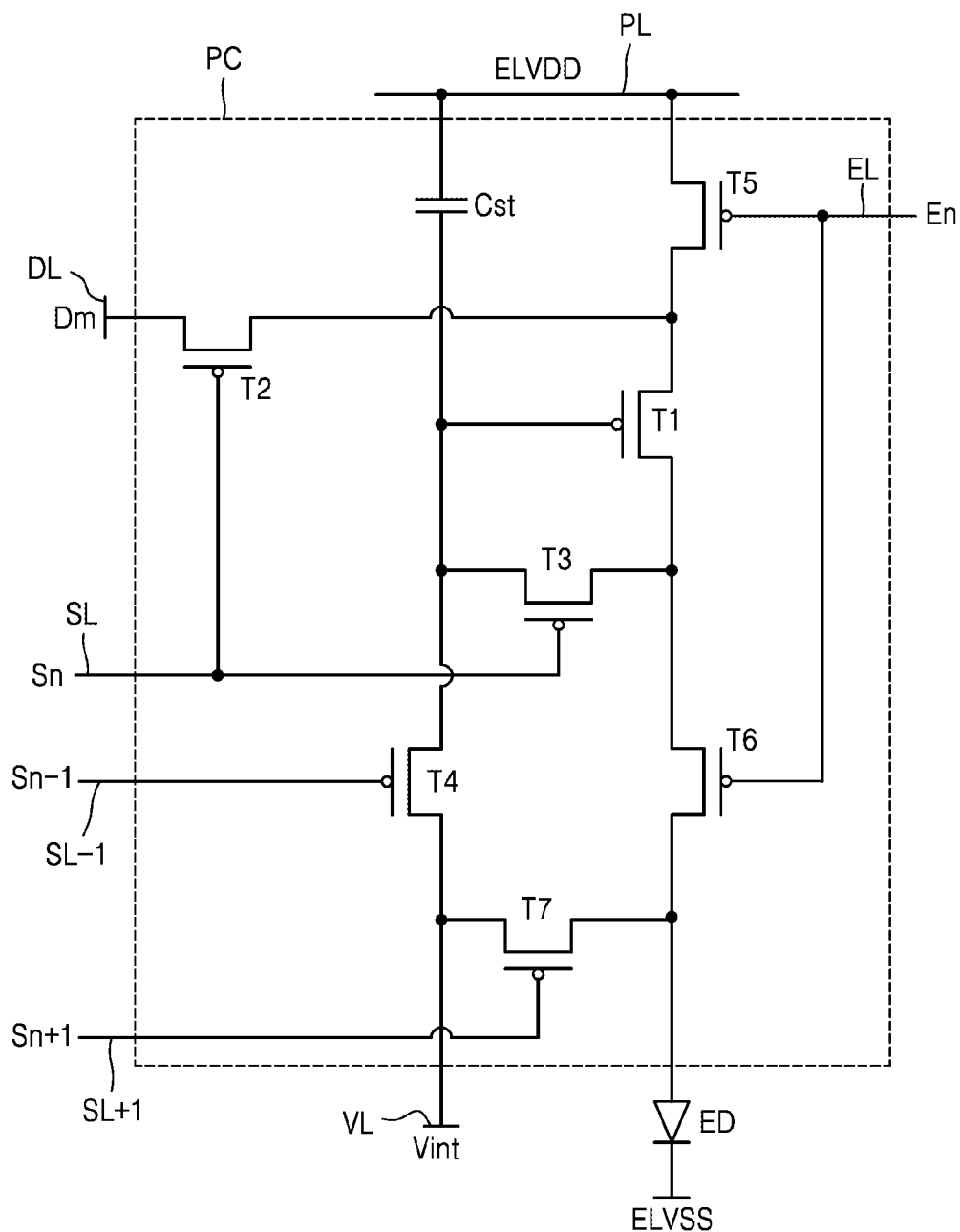
FIG. 2 is a circuit diagram schematically illustrating a pixel according to an embodiment.

FIG. 2 is a circuit diagram schematically illustrating a pixel according to an embodiment.

Referring to FIG. 2, a pixel circuit PC may include first to seventh transistors T1, T2, T3, T4, T5, T6, and T7, a storage capacitor Cst. Also, the pixel circuit PC may be connected to signal lines, an initialization voltage line VL, and a power supply voltage line PL. The signal lines may include a data line DL, a first scan line SL, a second scan line SL+1, a third scan line SL−1, and an emission control line EL. According to another embodiment, at least one of the signal lines, the initialization voltage line VL, and/or the power supply voltage line PL may be shared by neighboring pixel circuits.

The power supply voltage line PL may be configured to transmit a first power supply voltage ELVDD to the first transistor T1. The initialization voltage line VL may be configured to transmit, to the pixel circuit PC, an initialization voltage Vint for initializing the first transistor T1.

The first scan line SL, the second scan line SL+1, the third scan line SL−1, the emission control line EL, and the initialization voltage line VL may extend in a first direction (x) and may be apart from each other in each row. The data line DL and the power supply voltage line PL may extend in a second direction (y) and may be apart from each other in each column.

In FIG. 2, of the first to seventh transistors T1 to T7, the third transistor T3 and the fourth transistor T4 may be implemented as an n-channel metal-oxide semiconductor field effect transistor (MOSFET) (NMOS), and the others may be implemented as a p-channel MOSFET (PMOS).

The first transistor T1 may be connected to the power supply voltage line PL via the fifth transistor T5 and may be electrically connected to the organic light-emitting diode OLED via the sixth transistor T6. The first transistor T1 may act as a driving transistor. The first transistor T1 may be configured to receive a data signal DATA according to the switching operation of the second transistor T2 and supply a driving current IDLED to the organic light-emitting diode OLED.

The second transistor T2 may act as a switching transistor. The second transistor T2 may be connected to the first scan line SL and the data line DL and connected to the power supply voltage line PL via the fifth transistor T5. The second transistor T2 may be turned on in response to a first scan signal Sn received through the first scan line SL to perform a switching operation to transmit the data signal DATA received through the data line DL to a node N1.

The third transistor T3 may act as a compensation transistor. The third transistor T3 may be connected to the first scan line SL and connected to the organic light-emitting diode OLED via the sixth transistor T6. The third transistor T3 may be turned on in response to a first scan signal Sn received through the first scan line SL to diode-connect the first transistor T1.

The fourth transistor T4 may act as a first initialization transistor. The fourth transistor T4 may be connected to the third scan line SL−1, which may be a previous scan line, and the initialization voltage line VL and may be turned on in response to a third scan signal Sn−1, which may be a previous scan signal received through the third scan line SL−1, and transmits the initialization voltage Vint from the initialization voltage line VL to a gate electrode of the first transistor T1 to initialize the voltage of the gate electrode of the first transistor T1.

The fifth transistor T5 may act as an operation control transistor, and the sixth transistor T6 may act as an emission control transistor. The fifth transistor T5 and the sixth transistor T6 may be connected to the emission control line EL and may be simultaneously turned on in response to an emission control signal EM received through the emission control line EL to form a current path so that the driving current IDLED may flow in a direction from the power supply voltage line PL to the organic light-emitting diode OLED.

The seventh transistor T7 may act as a second initialization transistor. The seventh transistor T7 may be connected to the second scan line SL+1, which may be a next scan line, and the initialization voltage line VL and may be turned on in response to a second scan signal Sn+1, which may be a next scan signal received through the second scan line SL+1, and transmits the initialization voltage Vint from the initialization voltage line VL to the organic light-emitting diode OLED to initialize the organic light-emitting diode OLED. The seventh transistor T7 may be omitted.

The storage capacitor Cst may include a first electrode CE1 and a second electrode CE2. The first electrode CE1 may be connected to the gate electrode of the first transistor T1, and the second electrode CE2 may be connected to the power supply voltage line PL. The first capacitor Cst may store and maintain a voltage corresponding to a voltage difference between the power supply voltage line PL and the gate electrode of the first transistor T1, and thus, the voltage applied to the gate electrode of the first transistor T1 may be maintained.

The organic light-emitting diode OLED includes a pixel electrode and an opposite electrode, and the opposite electrode may be configured to receive a second power supply voltage ELVSS. The organic light-emitting diode OLED may be configured to receive the driving current IDLED from the first transistor T1 and emit light to display an image.

A detailed operation of each pixel circuit PC according to an embodiment is as follows.

During a first initialization period, in case that the third scan signal Sn−1 is supplied through the third scan line SL−1, the fourth transistor T4 may be turned on in response to the third scan signal Sn−1, and the first transistor T1 may be initialized by the initialization voltage Vint supplied from the initialization voltage line VL.

During a data programming period, in case that the first scan signal Sn is supplied through the first scan line SL, the second transistor T2 and the third transistor T3 may be respectively turned on in response to the first scan signal Sn. In this case, the first transistor T1 may be diode-connected by the turned-on third transistor T3 and may be forward biased. A voltage obtained by compensating a threshold voltage (Vth) of the first transistor T1 in the data signal Dm supplied from the data line DL may be applied to the gate electrode of the first transistor T1. The first power supply voltage ELVDD and the compensation voltage may be applied to both ends of the storage capacitor Cst, and charges corresponding to the voltage difference between both ends of the storage capacitor Cst may be stored in the storage capacitor Cst.

During an emission period, the fifth transistor T5 and the sixth transistor T6 may be turned on in response to the emission control signal En supplied from the emission control line EL. The driving current IDLED may be generated according to the voltage difference between the voltage of the gate electrode of the first transistor T1 and the first power supply voltage ELVDD, and the driving current IDLED may be supplied to the organic light-emitting diode OLED through the sixth transistor T6.

During a second initialization period, in case that the second scan signal Sn+1 is supplied through the second scan line SL+1, the seventh transistor T7 may be turned on in response to the second scan signal Sn+1, and the organic light-emitting diode OLED may be turned on by the initialization voltage Vint supplied from the initialization voltage line VL.

In an embodiment, at least one of the first to seventh transistors T1 to T7 may include a semiconductor layer including oxide, and the others thereof each may include a semiconductor layer including silicon. Specifically, the first transistor that directly influences the brightness of the display apparatus may be configured to include a semiconductor layer including polycrystalline silicon having high reliability. Thus, a high-resolution display apparatus may be implemented.

Figure 3:
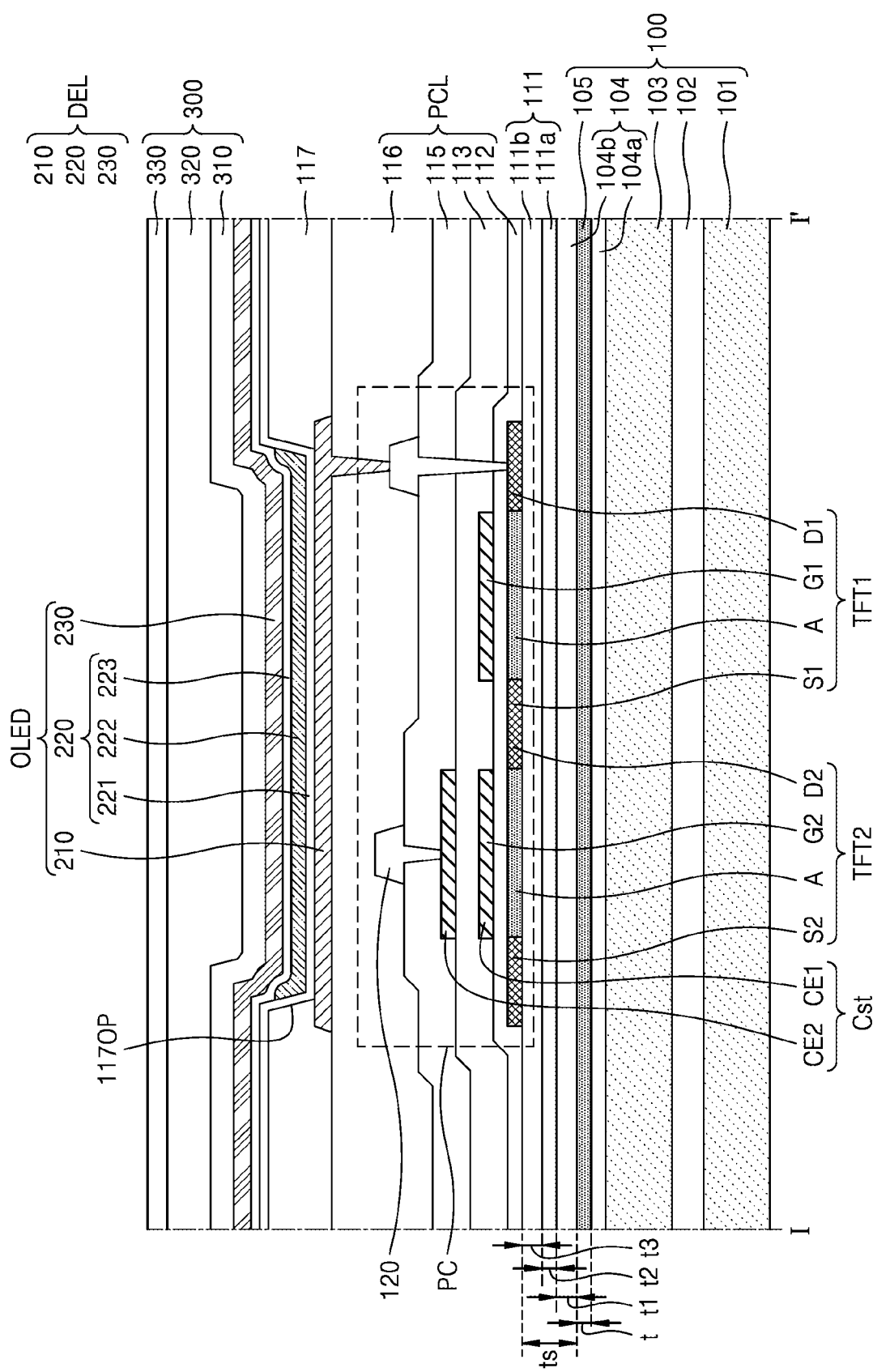
FIG. 3 is a schematic cross-sectional view of the display apparatus taken along line I-I' of FIG. 1.

FIG. 3 is a schematic cross-sectional view of the display apparatus taken along line I-I' of FIG. 1.

Hereinafter, a structure of a display apparatus according to an embodiment will be described in detail according to a stacking order with reference to FIG. 3.

The substrate 100 may include a glass material, a ceramic material, a metal material, a plastic material, a flexible or bendable material, or a combination thereof. In case that the substrate 100 is flexible or bendable, the substrate 100 may include a polymer resin such as polyethersulfone (PES), polyacrylate, polyetherimide (PEI), polyethylene naphthalate (PEN), polyethylene terephthalate (PET), polyphenylene sulfide (PPS), polyarylate, polyimide (PI), polycarbonate (PC), cellulose acetate propionate (CAP), or a combination thereof.

The substrate 100 may have a single-layer or multilayer structure including the above-described material. In case that the substrate 100 has a multilayer structure, the substrate 100 may further include an inorganic layer. In an embodiment, the substrate 100 may include a lower organic layer 101, a lower barrier layer 102, an upper organic layer 103, and an upper barrier layer 104. The lower organic layer 101 and the upper organic layer 103 may each include a polymer resin, and the lower barrier layer 102 and the upper barrier layer 104 may each be a barrier layer that prevents infiltration of impurities from the outside.

The lower barrier layer 102 may be between the lower organic layer 101 and the upper organic layer 103. The lower barrier layer 102 may include an inorganic material such as an oxide or a nitride, an organic material, or an organic/inorganic composite material, and may have a single-layer or multilayer structure including an inorganic material and an organic material. For example, the lower barrier layer 102 may be a single layer or layers including an inorganic material such as silicon nitride ($SiN_x$), silicon oxynitride (SiON), or silicon oxide ($SiO_x$).

In an embodiment, the upper barrier layer 104 may be on the upper organic layer 103 and may have a multilayer structure. For example, the upper barrier layer 104 may include a first inorganic barrier layer 104a, a shielding layer 105, and a second inorganic barrier layer 104b. The first inorganic barrier layer 104a may include an inorganic material such as silicon nitride ($SiN_x$), silicon oxynitride (SiON), or silicon oxide ($SiO_x$). The second inorganic barrier layer 104b may include an inorganic material such as silicon oxynitride (SiON) or silicon oxide ($SiO_x$). In an embodiment, the first inorganic barrier layer 104a and the second inorganic barrier layer 104b may include a same material. For example, the first inorganic barrier layer 104a and the second inorganic barrier layer 104b may include silicon oxide ($SiO_x$).

The shielding layer 105 may be between the first inorganic barrier layer 104a and the second inorganic barrier layer 104b. The shielding layer 105 may cover the entire surface of the substrate 100 like the first inorganic barrier layer 104a and the second inorganic barrier layer 104b. In an embodiment, the shielding layer 105 may include an oxide semiconductor material. For example, the shielding layer 105 may include a Zn oxide-based material such as Zn oxide, In—Zn oxide, Ga—In—Zn oxide, or a combination thereof. In some embodiments, the shielding layer 105 may include indium gallium zinc oxide (IGZO), indium tin zinc oxide (ITZO), and/or indium tin gallium zinc oxide (ITGZO) semiconductors, in which a metal such as indium (In), gallium (Ga), or tin (Sn) may be included in ZnO. The shielding layer 105 may be on the first inorganic barrier layer 104a to secure sufficient adhesion to the upper organic layer 103.

In an embodiment, the thickness t of the shielding layer 105 may be about 50 Å to about 10,000 Å. Alternatively, the thickness t of the shielding layer 105 may be about 500 Å to about 8,000 Å. In case that the thickness t of the shielding layer 105 is small, signal crosstalk caused by the shielding layer 105 may occur. For example, due to a specific pattern in a screen, a gray scale of a surrounding screen appears with a luminance different from a given gray scale. On the other hand, in case that the thickness t of the shielding layer 105 is too great, the substrate 100 may be curved due to the stress of the shielding layer 105.

For example, a curvature of a thin film may be expressed as follows.

$$\text{Curvature} = \frac{1}{\Delta R} \propto \sigma \times t_{film}$$

$t_{film}$ represents the thickness of the thin film, and a represents the stress applied to the thin film. Therefore, as the thickness t of the shielding layer 105 increases, the curvature of the substrate 100 due to the shielding layer 105 may increase. Because the process may not be normally performed due to the curvature of the substrate 100, the thickness t of the shielding layer 105 may be 8,000 Å or less.

A buffer layer 111 may be on the substrate 100. The buffer layer 111 may be on the substrate 100 to reduce or prevent infiltration of foreign material, moisture, or ambient air from the substrate 100 and provide a flat surface on the substrate 100. The buffer layer 111 may include an inorganic material such as an oxide or a nitride, an organic material, or an organic/inorganic composite material, and may have a single-layer or multilayer structure including an inorganic material and an organic material.

In an embodiment, the buffer layer 111 may have a multilayer structure in which a first buffer layer 111a and a second buffer layer 111b may be sequentially stacked on each other. The first buffer layer 111a may be directly on the second inorganic barrier layer 104b, the second inorganic barrier layer 104b may include a first inorganic insulating material, and the first buffer layer 111a may include a second inorganic insulating material having a different composition from the first inorganic insulating material. For example, the second inorganic insulating material may be silicon nitride ($SiN_x$), and the first inorganic insulating material may be silicon oxide ($SiO_x$). Because silicon nitride ($SiN_x$) forms a dense thin film, the diffusion of ambient air such as oxygen and moisture into the pixel circuit layer PCL may be effectively blocked. However, because silicon nitride ($SiN_x$) includes hydrogen itself, silicon nitride ($SiN_x$) functions as an electrical donor to make the shielding layer 105 conductive in case directly contacting the shielding layer 105 including an oxide semiconductor material. Therefore, in case that the first buffer layer 111a includes silicon nitride ($SiN_x$), the second inorganic barrier layer 104b including a material different from that of the first buffer layer 111a may be between the shielding layer 105 and the first buffer layer 111a.

The second buffer layer 111b may be on the first buffer layer 111a. In an embodiment, the second buffer layer 111b may include silicon oxide ($SiO_x$). In this case, the thickness t2 of the first buffer layer 111a may be about 500 Å, and the thickness t3 of the second buffer layer 111b may be about 3,000 Å. In an embodiment, the sum is of the thickness t1 of the second inorganic barrier layer 104b, the thickness t2 of the first buffer layer 111a, and the thickness t3 of the second buffer layer 111b may be about 3,500 Å to about 15,000 Å. Therefore, the electrical influence of the shielding layer 105 on the pixel circuit PC may be reduced by securing a sufficient distance between the shielding layer 105 and the pixel circuit PC.

The pixel circuit layer PCL may be on the buffer layer 111 and may include a pixel circuit PC, a first gate insulating layer 112, a second gate insulating layer 113, an interlayer insulating layer 115, and a planarization layer 116. The pixel circuit PC may include a first thin-film transistor TFT1, a second thin-film transistor TFT2, and a storage capacitor Cst.

The first thin-film transistor TFT1 and the second thin-film transistor TFT2 may be on the buffer layer 111. The first thin-film transistor TFT1 may include a semiconductor layer A, a first gate electrode G1, a first source region S1, and a first drain region D1, and the second thin-film transistor TFT2 may include a semiconductor layer A, a second gate electrode G2, a second source region S2, and a second drain region D2.

The semiconductor layer A may be on the buffer layer 111 and may include an oxide semiconductor material. For example, the semiconductor layer A may include a Zn oxide-based material such as Zn oxide, In—Zn oxide, Ga—In—Zn oxide, or a combination thereof. In some embodiments, the semiconductor layer A may include indium gallium zinc oxide (IGZO), indium tin zinc oxide (ITZO), and indium tin gallium zinc oxide (ITGZO) semiconductors, in which a metal such as indium (In), gallium (Ga), and tin (Sn) may be included in ZnO. In an embodiment, the semiconductor layer A and the shielding layer 105 may include a same material. The semiconductor layer A may include a channel region, and source regions S1 and S2 and drain regions D1 and D2 doped with impurities. In an embodiment, as illustrated, the source region S1 of the first thin-film transistor TFT1 and the drain region D2 of the second thin-film transistor TFT2 may be the same region.

The first gate insulating layer 112 may cover the semiconductor layer A. The first gate insulating layer 112 may include an inorganic insulating material such as silicon oxide ($SiO_x$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), or a combination thereof. The first gate insulating layer 112 may have a single-layer or multilayer structure including the above-described inorganic insulating material.

The first gate electrode G1 and the second gate electrode G2 may be on the first gate insulating layer 112. The first gate electrode G1 and the second gate electrode G2 may include molybdenum (Mo), aluminum (Al), copper (Cu), titanium (Ti), and the like, or a combination thereof, and may have a single-layer or multilayer structure. For example, the first gate electrode G1 and the second gate electrode G2 may be a single molybdenum (Mo) layer.

The second gate insulating layer 113 may cover the first gate electrode G1 and the second gate electrode G2. The second gate insulating layer 113 may include an inorganic insulating material such as silicon oxide ($SiO_x$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), or a combination thereof. The second gate insulating layer 113 may include a single layer or layers including the above-described inorganic insulating material.

The second electrode CE2 of the storage capacitor Cst may be on the second gate insulating layer 113. The second electrode CE2 may overlap the second gate electrode G2 therebelow. The second gate electrode G2 overlapping the second electrode CE2 with the second gate insulating layer 113 therebetween may function as the first electrode CE1 of the storage capacitor Cst.

The second electrode CE2 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu), and may include a single layer or layers including the above-described material.

The interlayer insulating layer 115 may cover the second electrode CE2. The interlayer insulating layer 115 may include silicon oxide ($SiO_x$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), or a combination thereof. The interlayer insulating layer 115 may include a single layer or layers including the above-described inorganic insulating material.

An electrode layer 120 may be on the interlayer insulating layer 115. The electrode layer 120 may include wirings connected to the second gate electrode G2 and the first drain region D1. The electrode layer 120 may include a conductive material including molybdenum (Mo), aluminum (Al), copper (Cu), titanium (Ti), and the like, or a combination thereof, and may include a single layer or layers including the above-described conductive material. For example, the electrode layer 120 may have a multilayer structure of Ti/Al/Ti.

The planarization layer 116 may cover the electrode layer 120. The planarization layer 116 may have a flat upper surface so that the pixel electrode 210 arranged thereon may be formed to be flat.

The planarization layer 116 may include an organic material or an inorganic material, and may have a single-layer or multilayer structure. This planarization layer 116 may include general-purpose polymer (e.g., benzocyclobutene (BCB), polyimide, hexamethyldisiloxane (HMDSO), polymethylmethacrylate (PMMA), or polystyrene (PS)), polymer derivatives having a phenolic group, acrylic polymer, imide polymer, aryl ether polymer, amide polymer, fluorine polymer, p-xylene polymer, or vinyl alcohol polymer, or a combination thereof. On the other hand, the planarization layer 116 may include an inorganic insulating material such as silicon oxide ($SiO_x$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), or a combination thereof. In case that the planarization layer 116 is formed, a layer may be formed, and then, chemical mechanical polishing may be performed on the upper surface of the layer so as to provide a flat upper surface.

The display element layer DEL may include a pixel electrode 210, and an intermediate layer 220 and an opposite electrode 230 on the pixel electrode 210. The intermediate layer 220 may include an emission layer 222 that may be patterned to correspond to the pixel electrode 210.

The pixel electrode 210 may be on the planarization layer 116. The pixel electrode 210 may include a conductive oxide such as indium tin oxide (ITO), indium zinc oxide (IZO), zinc oxide (ZnO), indium oxide ($In_2O_3$), indium gallium oxide (IGO), aluminum zinc oxide (AZO), or a combination thereof. The pixel electrode 210 may include a reflective layer including silver (Ag), magnesium (Mg), aluminum (Al), platinum (Pt), palladium (Pd), gold (Au), nickel (Ni), neodymium (Nd), iridium (Ir), chromium (Cr), or any compound thereof. For example, the pixel electrode 210 may have a structure including layers including ITO, IZO, ZnO, or $In_2O_3$ above/below the above-described reflective layer. In this case, the pixel electrode 210 may have a stack structure of ITO/Ag/ITO.

A pixel defining layer 117 may cover the edge of the pixel electrode 210 on the planarization layer 116, and may include an opening 1170P exposing the central portion of the pixel electrode 210. The opening 1170P may define the size and shape of the emission area of the organic light-emitting diode OLED, that is, the sub-pixel.

The pixel defining layer 117 may prevent an electric arc or the like from occurring on the edge of the pixel electrode 210 by increasing the distance between the edge of the pixel electrode 210 and the opposite electrode 230 on the pixel electrode 210. The pixel defining layer 117 may include an organic insulating material such as polyimide, polyamide, acrylic resin, benzocyclobutene, HMDSO, phenol resin, or a combination thereof, and may be formed by spin coating.

The emission layer 222 corresponding to the pixel electrode 210 may be in the opening 1170P of the pixel defining layer 117. The emission layer 222 may include a high molecular weight material or a low molecular weight material, and may emit red light, green light, blue light, or white light.

Organic functional layers 221 and 223 may be above and/or below the emission layer 222. The organic functional layers 221 and 223 may include a first functional layer 221 and/or a second functional layer 223. The first functional layer 221 or the second functional layer 223 may be omitted.

The first functional layer 221 may be below the emission layer 222. The first functional layer 221 may be a single layer or layers including an organic material. The first functional layer 221 may be a hole transport layer (HTL) having a single-layer structure. Alternatively, the first functional layer 221 may include a hole injection layer (HIL) and an HTL. The first functional layer 221 may be integrally provided to correspond to the organic light-emitting diodes OLED included in the display area (see DA of FIG. 1).

The second functional layer 223 may be on the emission layer 222. The second functional layer 223 may be a single layer or layers including an organic material. The second functional layer 223 may include an electron transport layer (ETL) and/or an electron injection layer (EIL). The second functional layer 223 may be integrally provided to correspond to the organic light-emitting diodes OLED included in the display area (see DA of FIG. 1).

The opposite electrode 230 may be on the second functional layer 223. The opposite electrode 230 may include a conductive material having a low work function. For example, the opposite electrode 230 may include a (semi) transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or any alloy thereof. Alternatively, the opposite electrode 230 may further include a layer such as ITO, IZO, ZnO, or $In_2O_3$ on the (semi)transparent layer including the above-described material.

A capping layer (not illustrated) including an organic material may be on the opposite electrode 230. The capping layer may be a layer provided to protect the opposite electrode 230 and increase light extraction efficiency. The capping layer may include a material having a refractive index higher than that of the opposite electrode 230. In an embodiment, the capping layer may further include LiF. Alternatively, the capping layer may further include an inorganic insulating material such as silicon oxide ($SiO_x$) or silicon nitride ($SiN_x$).

The display element layer DEL may be covered with a thin-film encapsulation layer 300. The thin-film encapsulation layer 300 may include an inorganic encapsulation layer including at least one inorganic material and an organic encapsulation layer including at least one organic material. In an embodiment, the thin-film encapsulation layer 300 may have a structure in which a first inorganic encapsulation layer 310, an organic encapsulation layer 320, and a second inorganic encapsulation layer 330 may be stacked on each other. The first and second inorganic encapsulation layers 310 and 330 may include an inorganic insulating material such as silicon oxide ($SiO_x$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), or a combination thereof. The organic encapsulation layer 320 may include general-purpose polymer (e.g., BCB, HMDSO, PMMA, or PS), polymer derivatives having a phenolic group, acrylic polymer, imide polymer, aryl ether polymer, amide polymer, fluorine polymer, p-xylene polymer, vinyl alcohol polymer, or a combination thereof.

Although not illustrated, elements such as an input sensing member configured to sense a touch input, an anti-reflection member including a polarizer and a retarder or a color filter and a black matrix, and a transparent window may be further on the thin-film encapsulation layer 300.

On the other hand, in an embodiment, the thin-film encapsulation layer 300 may be used as an encapsulation member for encapsulating the display element layer DEL, but the disclosure is not limited thereto. For example, as the member for encapsulating the display element layer DEL, an encapsulation substrate (e.g., a glass substrate, etc.) bonded to the substrate 100 by a sealant or frit may be used.

FIGS. 4 to 7 are cross-sectional views schematically illustrating a method of manufacturing a display apparatus, according to an embodiment.

Figure 4:
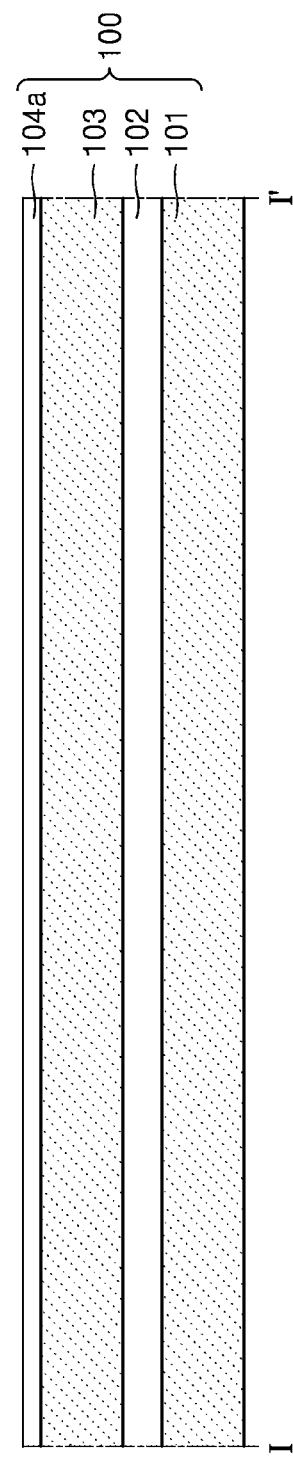
FIGS. 4 to 7 are cross-sectional views schematically illustrating a method of manufacturing a display apparatus, according to an embodiment.

Referring to FIG. 4, a lower organic layer 101, a lower barrier layer 102, an upper organic layer 103, and a first inorganic barrier layer 104a may be sequentially stacked on each other.

The lower organic layer 101 may be formed on a carrier substrate (not illustrated). The carrier substrate may support a substrate 100, which may be flexible, in a manufacturing process, and may be removed after the process. In an embodiment, the carrier substrate may be glass.

The lower organic layer 101 may include a polymer resin. For example, the lower organic layer 101 may include a polymer resin such as polyethersulfone (PES), polyacrylate, polyetherimide (PEI), polyethylene naphthalate (PEN), polyethylene terephthalate (PET), polyphenylene sulfide (PPS), polyarylate, polyimide (PI), polycarbonate (PC), cellulose acetate propionate (CAP), or a combination thereof. In an embodiment, the lower organic layer 101 may be formed by coating the above-described polymer resin on the carrier substrate.

The lower barrier layer 102 may be formed on the lower organic layer 101. The lower barrier layer 102 may include an inorganic material such as an oxide or a nitride, an organic material, or an organic/inorganic composite material, and may have a single-layer or multilayer structure including an inorganic material and an organic material. For example, the lower barrier layer 102 may be a single layer or layers including an inorganic material such as silicon nitride ($SiN_x$), silicon oxynitride (SiON), or silicon oxide ($SiO_x$).

The upper organic layer 103 may be formed on the lower barrier layer 102. The upper organic layer 103 may include a polymer resin. In an embodiment, the upper organic layer 103 and the lower organic layer 101 may include a same material. For example, the lower organic layer 101 and the upper organic layer 103 may include polyimide (PI).

The first inorganic barrier layer 104a may be formed on the upper organic layer 103. The first inorganic barrier layer 104a may include an inorganic material such as silicon nitride ($SiN_x$), silicon oxynitride (SiON), silicon oxide ($SiO_x$), or a combination thereof. The first inorganic barrier layer 104a may improve adhesion between the upper organic layer 103 and the shielding layer 105, thereby minimizing or preventing delamination of the shielding layer 105 from the upper organic layer 103.

Figure 5:
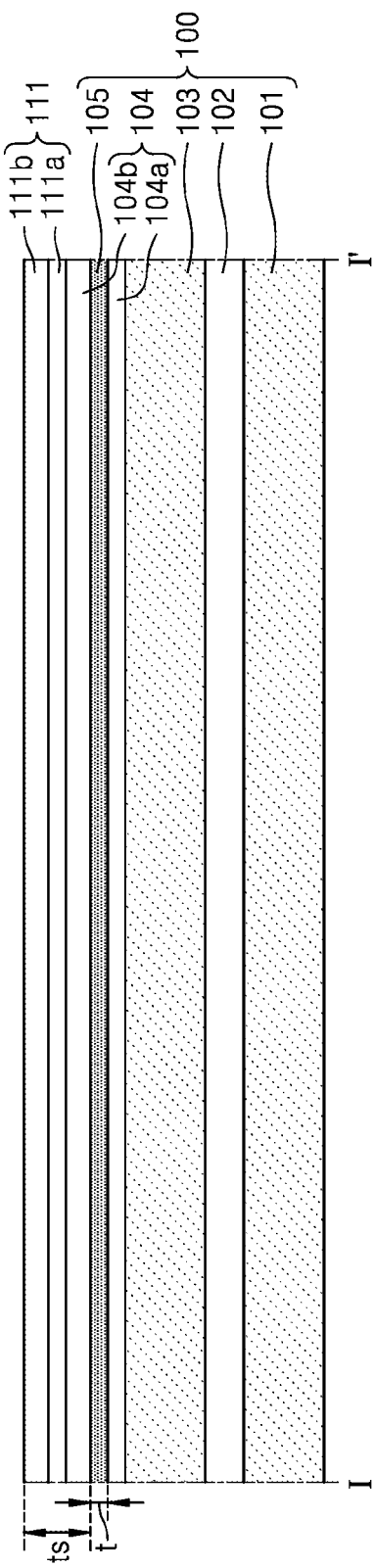

Referring to FIG. 5, the shielding layer 105 may be formed on the first inorganic barrier layer 104a. The shielding layer 105 may include an oxide semiconductor material.

In an embodiment, the shielding layer 105 may include a Zn oxide-based material such as Zn oxide, In—Zn oxide, Ga—In—Zn oxide, or a combination thereof. In some embodiments, the shielding layer 105 may include at least one of indium gallium zinc oxide (IGZO), indium tin zinc oxide (ITZO), and indium tin gallium zinc oxide (ITGZO) semiconductors, in which a metal such as indium (In), gallium (Ga), and tin (Sn) may be included in ZnO. The shielding layer 105 and a semiconductor layer A to be described below may include a same material.

In the forming of the shielding layer 105, electrical characteristics of the shielding layer 105 may be controlled by adjusting an oxygen partial pressure. For example, in case that the shielding layer 105 is formed, the proportion of oxygen in a mixed gas inside a chamber may be about 10% to about 80% so that the shielding layer 105 may sufficiently shield an electric field generated from wirings and a pixel circuit layer PCL on the substrate 100. Alternatively, in case that the shielding layer 105 is formed, the proportion of oxygen in the mixed gas inside the chamber may be about 20% to about 60%.

In an embodiment, the shielding layer 105 may be formed to have a thickness t1 of about 50 Å to about 10,000 Å. In an embodiment, in order to prevent signal crosstalk caused by the shielding layer 105, the shielding layer 105 may be formed to have a thickness t1 of 500 Å or more. In an embodiment, in order to minimize curvature of the substrate 100 due to the shielding layer 105, the shielding layer 105 may be formed to have a thickness t of 8,000 Å or less.

A second inorganic barrier layer 104b may be formed on the shielding layer 105. The second inorganic barrier layer 104b may include an inorganic material such as silicon oxynitride (SiON) or silicon oxide ($SiO_x$). In an embodiment, the first inorganic barrier layer 104a and the second inorganic barrier layer 104b may be formed by using a same material. For example, the first inorganic barrier layer 104a and the second inorganic barrier layer 104b may be formed by using silicon oxide ($SiO_x$). Because the second inorganic barrier layer 104b may be formed on the shielding layer 105 to secure a sufficient distance between the shielding layer 105 and the pixel circuit layer PCL, signal crosstalk caused by the shielding layer 105 may be minimized.

A buffer layer 111 may be formed on the second inorganic barrier layer 104b. The buffer layer 111 may have a multi-layer structure in which layers including different materials from each other may be sequentially stacked on each other. In an embodiment, the buffer layer 111 may include a first buffer layer 111a on the second inorganic barrier layer 104b and a second buffer layer 111b on the first buffer layer 111a. In case that the second inorganic barrier layer 104b includes a first inorganic insulating material, the first buffer layer 111a may include a second inorganic insulating material having a composition different from that of the first inorganic insulating material. For example, the first inorganic insulating material may be silicon oxide ($SiO_x$), and the second inorganic insulating material may be silicon nitride ($SiN_x$). The second buffer layer 111b may include an inorganic insulating material having a composition different from that of the second inorganic insulating material. For example, the second buffer layer 111b may be silicon oxide ($SiO_x$). In an embodiment, the first buffer layer 111a may be formed to have a thickness of about 500 Å, and the second buffer layer 111b may be formed to have a thickness of about 3,000 Å. In an embodiment, a total thickness is of the second inorganic barrier layer 104b, the first buffer layer 111a, and the second buffer layer 111b between the shielding layer 105 and the pixel circuit layer PCL may be about 3,500 Å to about 15,000 Å.

In an embodiment, the first inorganic barrier layer 104a, the shielding layer 105, the second inorganic barrier layer 104b, the first buffer layer 111a, and the second buffer layer 111b may be continuously formed in the same chamber. Therefore, the shielding layer 105 may be formed to cover the entire surface of the substrate 100 without a separate patterning process.

Figure 6:
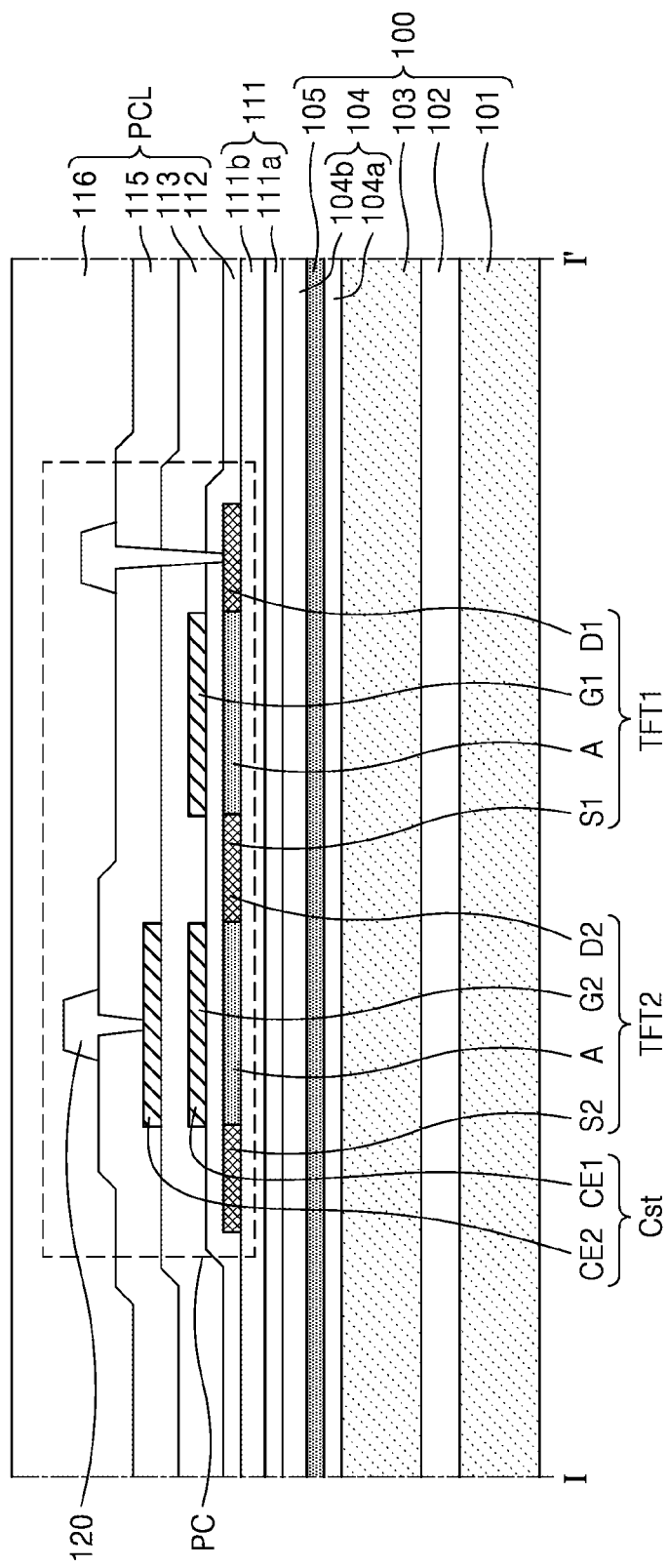

Referring to FIG. 6, the pixel circuit layer PCL may be formed on the buffer layer 111.

The semiconductor layer A may be formed on the buffer layer 111. The semiconductor layer A may include an oxide semiconductor material. For example, the semiconductor layer A may include a Zn oxide-based material such as Zn oxide, In—Zn oxide, Ga—In—Zn oxide or a combination thereof. In some embodiments, the semiconductor layer A may include indium gallium zinc oxide (IGZO), indium tin zinc oxide (ITZO), and indium tin gallium zinc oxide (ITGZO) semiconductors, in which a metal such as indium (In), gallium (Ga), and tin (Sn) may be included in ZnO. In an embodiment, the semiconductor layer A and the shielding layer 105 may include a same material. In the process of forming the semiconductor layer A, the change in electrical characteristics due to the shielding layer 105 may be offset by doping a channel region or controlling a temperature during heat treatment.

The pixel circuit layer PCL may be formed by forming a first gate insulating layer 112 to cover the semiconductor layer A and sequentially stacking a first gate electrode G1, a second gate electrode G2, a second gate insulating layer 113, a second electrode CE2, an interlayer insulating layer 115, an electrode layer 120, and a planarization layer 116 on the first gate insulating layer 112.

Figure 7:
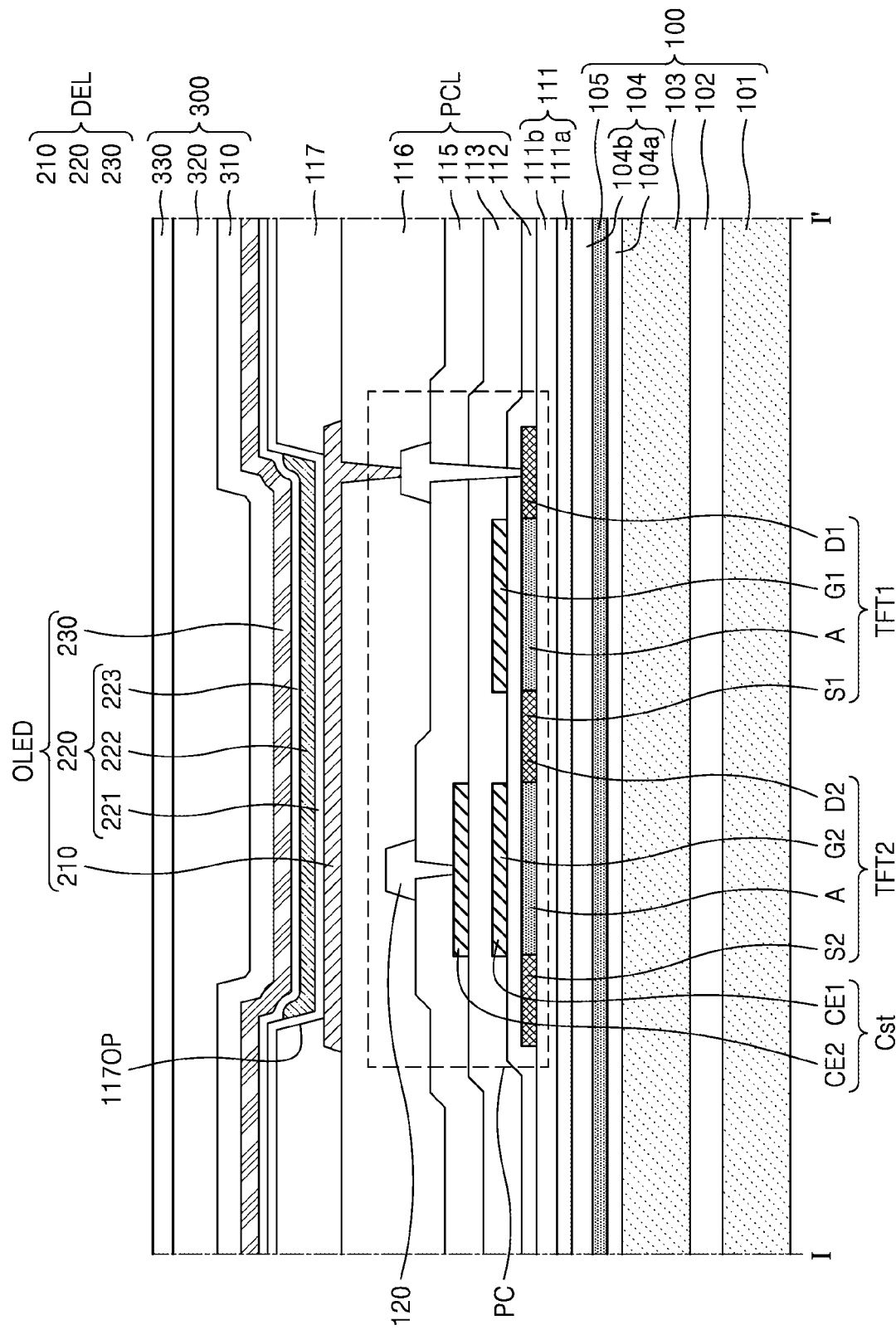

Referring to FIG. 7, a display element layer DEL may be formed on the pixel circuit layer PCL. A pixel electrode 210 may be formed on the planarization layer 116, and a pixel defining layer 117 covering the edge of the pixel electrode 210 may be formed. The display element layer DEL may be formed by sequentially stacking a first functional layer 221, an emission layer 222, a second functional layer 223, and an opposite electrode 230 on the pixel defining layer 117. In this case, the forming of the first functional layer 221 or the forming of the second functional layer 223 may be omitted.

A thin-film encapsulation layer 300 may be formed on the display element layer DEL. In an embodiment, the thin-film encapsulation layer 300 may be formed by sequentially stacking a first inorganic encapsulation layer 310, an organic encapsulation layer 320, and a second inorganic encapsulation layer 330 on the opposite electrode 230. On the other hand, in an embodiment, the thin-film encapsulation layer 300 is illustrated as an encapsulation member for encapsulating the display element layer DEL, but the disclosure is not limited thereto.

Figure 8A:
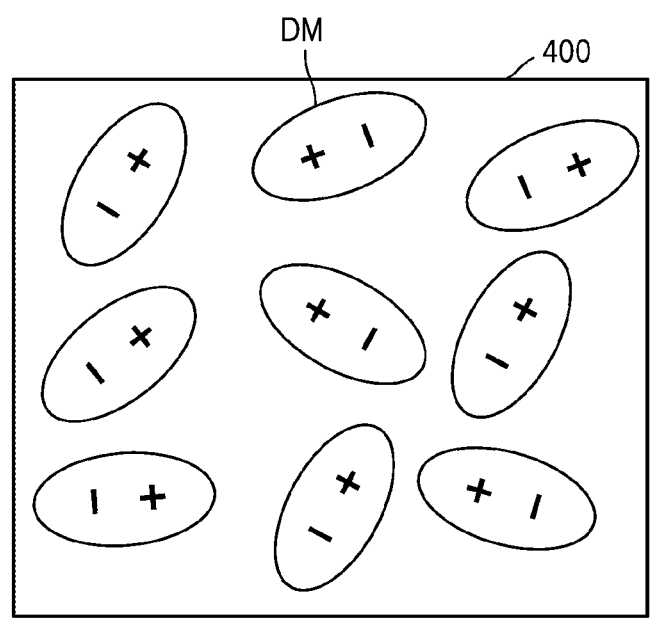
FIGS. 8A and 8B are schematic diagrams for describing an induced orientation polarization phenomenon of a substrate.
Figure 8B:
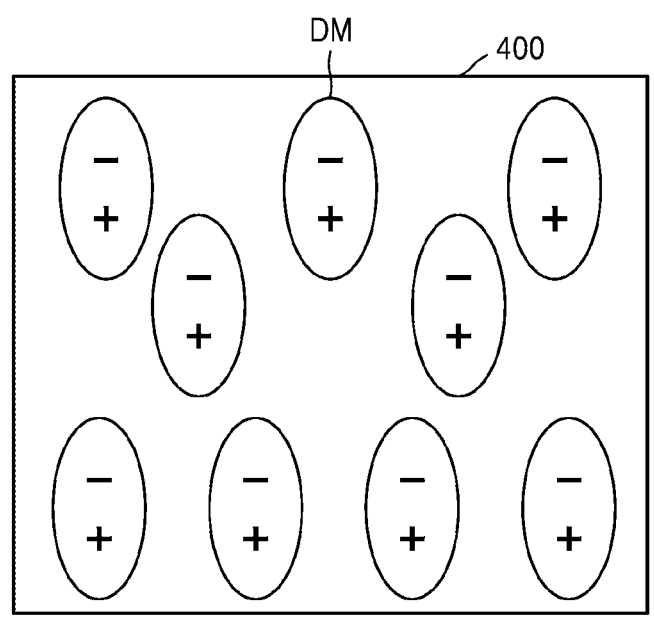

FIGS. 8A and 8B are schematic diagrams for describing an induced orientation polarization phenomenon of a substrate.

Referring to FIGS. 8A and 8B, an upper organic layer 400 may be affected by a pixel circuit and a signal line configured to apply a signal to the pixel circuit. For example, the upper organic layer 400 may include a polymer resin such as polyimide (PI). In such a polymer resin, in case that no electric field is applied, electric dipole moments (DMs) may be randomly arranged, as illustrated in FIG. 8A. However, in case that the electric field is applied to the polymer resin constituting the upper organic layer by the pixel circuit and the signal line configured to apply the signal to the pixel circuit, the DMs of the polymer resin may be aligned according to the direction of the electric field so that an induced orientation polarization phenomenon may occur, as illustrated in FIG. 8B.

The induced orientation polarization phenomenon generates an unintended electric field in the upper organic layer 400, thus affecting electrical characteristics of thin-film transistors. For example, the threshold voltage of the thin-film transistor may be changed by charges induced in the upper organic layer 400, which may cause a difference in luminance between pixels (see PX of FIG. 1).

Figure 9:
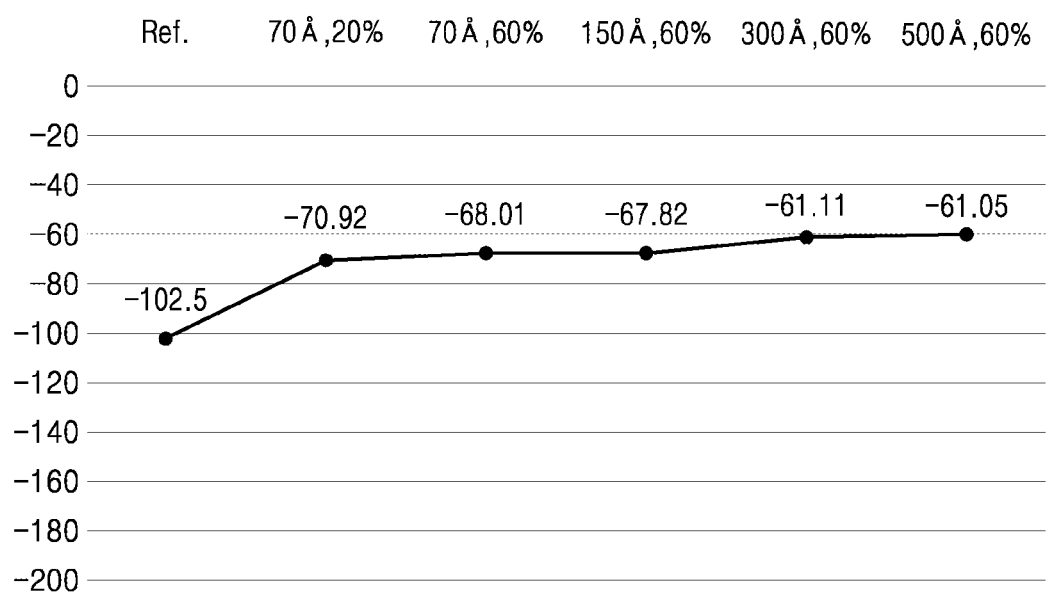
FIG. 9 is a graph schematically showing quantified values of a long-term afterimage phenomenon in a display apparatus, according to a comparative example and examples.

FIG. 9 is a graph schematically showing quantified values of a long-term afterimage phenomenon in a display apparatus, according to a comparative example and examples.

Black and white patterns alternately arranged on display apparatuses including a comparative example which uses a substrate not including a shielding layer and examples which include a shielding layer and of which the thickness and oxygen partial pressure may be differently adjusted in the forming of the shielding layer may be displayed for 30 minutes, and a screen may be switched to have a luminance value of 31/256 G. Transient contrast ratio (TCR) values were measured after 5 minutes, and image sticking figure of merit (ISFOM) values for quantifying the long-term afterimage phenomenon were calculated. As the absolute value of the calculated ISFOM value increases, the duration of the afterimage increases.

Referring to FIG. 9, the ISFOM value of the comparative example is −102.5, and the ISFOM values of the examples are −70.92 to −61.05. Therefore, it may be confirmed that the ISFOM values of the examples may be improved by 30% to 40%, compared with the ISFOM value of the comparative example.

Figure 10:
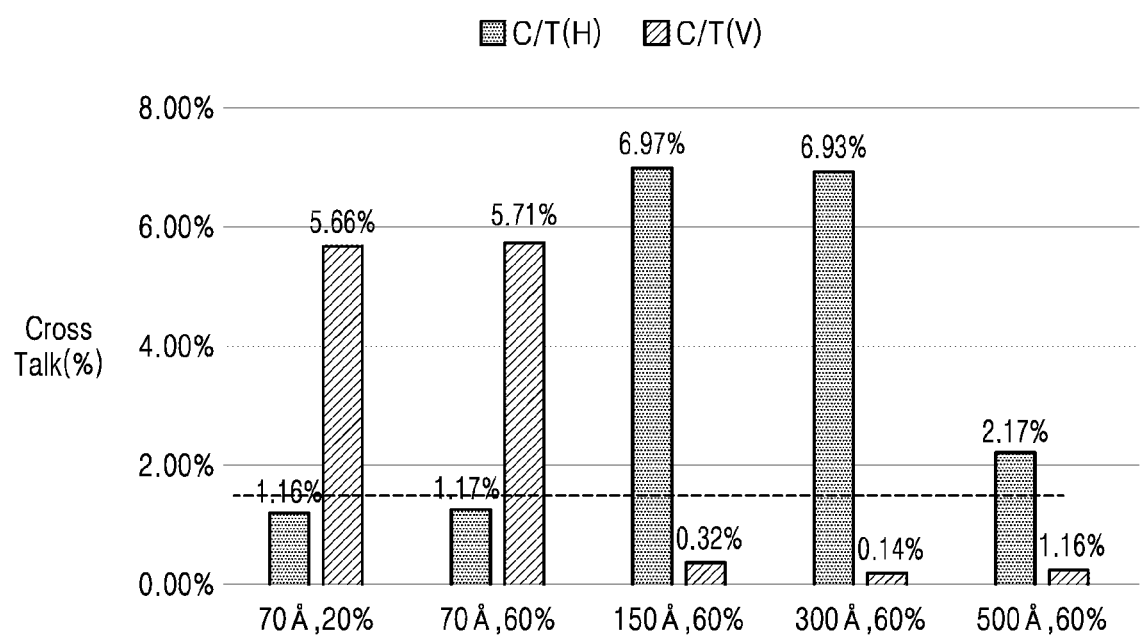
FIG. 10 is a graph schematically showing quantified values of a crosstalk phenomenon in a display apparatus, according to embodiments.

FIG. 10 is a graph schematically showing quantified values of a crosstalk phenomenon in a display apparatus, according to embodiments.

The crosstalk of the display apparatus means that a specific pattern within a screen affects the remaining area of the screen, and may occur to the left/right or top/bottom of the pattern. In order to quantify the crosstalk phenomenon of the display apparatus due to the shielding layer, the crosstalk of display apparatuses including the examples in which the thickness of the shielding layer and the oxygen partial pressure were differently adjusted during the forming of the shielding layer was evaluated according to product standards.

It was confirmed that, in the case in which the shielding layer included an IGZO semiconductor material, vertical crosstalk (C/T(V)) increased in case that the thickness of the shielding layer was 70 Å, and horizontal crosstalk (C/T(H)) increased in case that the thickness of the shielding layer was 150 Å and 300 Å. On the other hand, it was confirmed that, in case that the thickness of the shielding layer was 500 Å or more and the proportion of oxygen in the mixed gas was 60% at the time of forming the shielding layer, vertical crosstalk of the display apparatus was 0.24% and horizontal crosstalk of the display apparatus was 2.17%, which was close to a target value.

According to one or more embodiments, display apparatuses with improved flexibility may be implemented. The scope of the disclosure is not limited by such an effect.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure.

What is claimed is:

1. A display apparatus comprising:
a substrate including a lower organic layer, a lower barrier layer, an upper organic layer, and an upper barrier layer, which are sequentially stacked on each other;
a pixel circuit layer on the substrate; and
a display element layer on the pixel circuit layer,
wherein the upper barrier layer includes:
a first inorganic barrier layer on the upper organic layer;
a shielding layer on the first inorganic barrier layer, the shielding layer including an oxide semiconductor material; and
a second inorganic barrier layer on the shielding layer.

2. The display apparatus of claim 1, wherein the shielding layer includes at least one of indium gallium zinc oxide (IGZO), indium tin zinc oxide (ITZO), and indium tin gallium zinc oxide (ITGZO).

3. The display apparatus of claim 1, wherein a thickness of the shielding layer is about 50 Å to about 10,000 Å.

4. The display apparatus of claim 1, wherein the shielding layer covers an entire surface of the substrate.

5. The display apparatus of claim 1, wherein the upper organic layer includes polyimide.

6. The display apparatus of claim 1, further comprising:
a first buffer layer and a second buffer layer that are between the substrate and the pixel circuit layer, wherein;
the second inorganic barrier layer includes a first inorganic insulating material,
the first buffer layer includes a second inorganic insulating material, and
the first inorganic insulating material is different from the second inorganic insulating material.

7. The display apparatus of claim 6, wherein the second inorganic insulating material includes silicon nitride ($SiN_x$).

8. The display apparatus of claim 7, wherein the first inorganic insulating material includes silicon oxide ($SiO_x$).

9. The display apparatus of claim 6, wherein the first inorganic barrier layer includes the first inorganic insulating material.

10. The display apparatus of claim 6, wherein a sum of a thickness of the second inorganic barrier layer, a thickness of the first buffer layer, and a thickness of the second buffer layer is about 3,500 Å to about 15,000 Å.

11. The display apparatus of claim 1, wherein:
the pixel circuit layer includes a thin-film transistor;
the thin-film transistor includes:
a semiconductor layer;
a gate electrode at least partially overlapping the semiconductor layer in a plan view; and
an electrode layer on the gate electrode, and
the shielding layer and the semiconductor layer include a same material.

12. An electronic device comprising the display apparatus of claim 1.

13. A method of manufacturing a display apparatus, the method comprising:
forming a lower organic layer on a carrier substrate;
forming a lower barrier layer on the lower organic layer;
forming an upper organic layer on the lower barrier layer;
forming an upper barrier layer on the upper organic layer, the upper barrier layer including an oxide semiconductor material;
forming a pixel circuit layer on the upper barrier layer;
forming a display element layer on the pixel circuit layer; and
removing the carrier substrate.

14. The method of claim 13, wherein the forming of the upper barrier layer comprises:
forming a first inorganic barrier layer on the upper organic layer;
forming a shielding layer on the first inorganic barrier layer, the shielding layer including an oxide semiconductor material; and
forming a second inorganic barrier layer on the shielding layer.

15. The method of claim 14, wherein the shielding layer includes at least one of indium gallium zinc oxide (IGZO), indium tin zinc oxide (ITZO), and indium tin gallium zinc oxide (ITGZO).

16. The method of claim 14, wherein a thickness of the shielding layer is about 50 Å to about 10,000 Å.

17. The method of claim 14, wherein, a proportion of oxygen in a mixed gas inside a chamber is about 10% to about 80% in the forming of the shielding layer.

18. The method of claim 14, wherein:
the forming of the pixel circuit layer comprises:
sequentially forming a first buffer layer and a second buffer layer on the upper barrier layer;
forming a semiconductor layer on the second buffer layer;
forming a gate electrode on the semiconductor layer; and
forming an electrode layer on the gate electrode, and
the semiconductor layer and the shielding layer include a same material.

19. The method of claim 18, wherein:
the second inorganic barrier layer includes a first inorganic insulating material,
the first buffer layer includes a second inorganic insulating material, and
the first inorganic insulating material is different from the second inorganic insulating material.

20. The method of claim 19, wherein the second inorganic insulating material includes silicon nitride ($SiN_x$).

21. The method of claim 18, wherein a sum of a thickness of the second inorganic barrier layer, a thickness of the first buffer layer, and a thickness of the second buffer layer is about 3,500 Å to about 15,000 Å.

* * * * *